(12) United States Patent
Fu et al.

(10) Patent No.: US 8,780,538 B2
(45) Date of Patent: Jul. 15, 2014

(54) CABLE MANAGEMENT APPARATUS

(75) Inventors: Jia-Qi Fu, Shenzhen (CN); Meng-Qi Zhang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 274 days.

(21) Appl. No.: 13/304,386

(22) Filed: Nov. 24, 2011

(65) Prior Publication Data
US 2013/0077219 A1    Mar. 28, 2013

(30) Foreign Application Priority Data

Sep. 27, 2011  (CN) .......................... 2011 1 0294461

(51) Int. Cl.
*G06F 1/16* (2006.01)
*H01B 7/00* (2006.01)

(52) U.S. Cl.
USPC ...................................... 361/679.02; 361/826

(58) Field of Classification Search
USPC ......................................................... 361/826
See application file for complete search history.

(56) References Cited

U.S. PATENT DOCUMENTS

| | | | | |
|---|---|---|---|---|
| 2,571,832 | A * | 10/1951 | Chapin, Jr. | 191/12 R |
| 6,305,556 | B1 * | 10/2001 | Mayer | 211/26 |
| 6,417,452 | B1 * | 7/2002 | Doshita | 174/72 A |
| 8,387,933 | B2 * | 3/2013 | Yu et al. | 248/220.22 |
| 2001/0020429 | A1 * | 9/2001 | Serrano | 104/91 |

* cited by examiner

*Primary Examiner* — Tuan T Dinh
*Assistant Examiner* — Mukund G Patel
(74) *Attorney, Agent, or Firm* — Novak Druce Connolly Bove + Quigg LLP

(57) ABSTRACT

A cable management apparatus includes a guide rail, a number of slide members slidably mounted to the guide rail, and a number of cable supports. Each of the cable supports includes two arms hinged to each other. Each of the arms forms a first end and a second end. The first end of the former one of two neighboring cable supports and the second end of the latter cable support are rotatably connected to the slide member between the neighboring cable supports. The first end of the last cable support is connected to the guide rail. The cable supports are unfolded with the slide members sliding forwards along the guide rail to spread a cable rested on the cable supports. The cable supports are folded with the slide members sliding rearwards along the guide rail to wind up the cable.

14 Claims, 9 Drawing Sheets

CABLE MANAGEMENT APPARATUS

BACKGROUND

1. Technical Field

The present disclosure relates to a cable management apparatus.

2. Description of Related Art

A server generally includes a chassis and a plurality of electronic devices, such as a power supply, a fan, and a data storage device, slidably mounted in the chassis. The devices are electrically connected to a motherboard or other electronic devices with cables. The cables should be long enough to enable the devices to be withdrawn from the chassis for maintenance without disrupting the electrical connection through the cables. However, the long cables tend to interfere with the components in the chassis if the cables are not properly managed.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
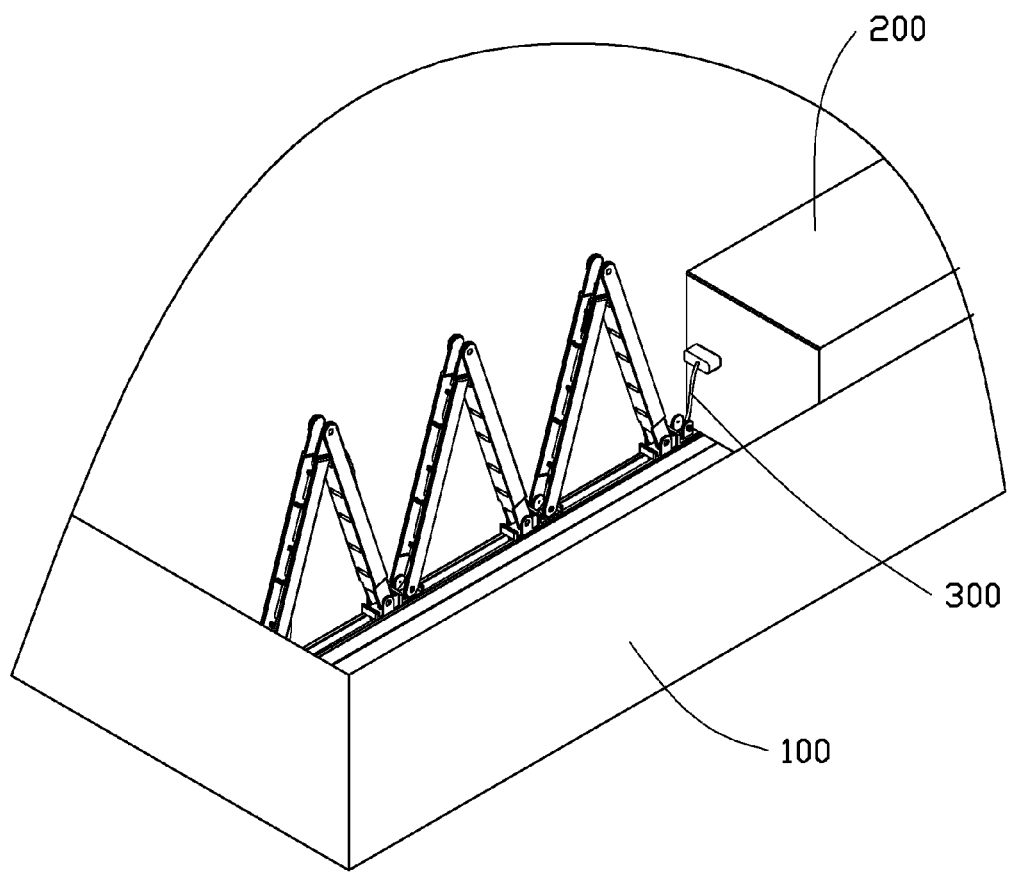
FIG. 1 is an isometric view of an embodiment of a cable management apparatus, an electronic device, and a chassis.

Referring to FIG. 1, an exemplary embodiment of a cable management apparatus is mounted to a chassis 100 of a server, to manage a cable 300 extending from an electronic device 200 mounted in the chassis 100.

Figure 2:
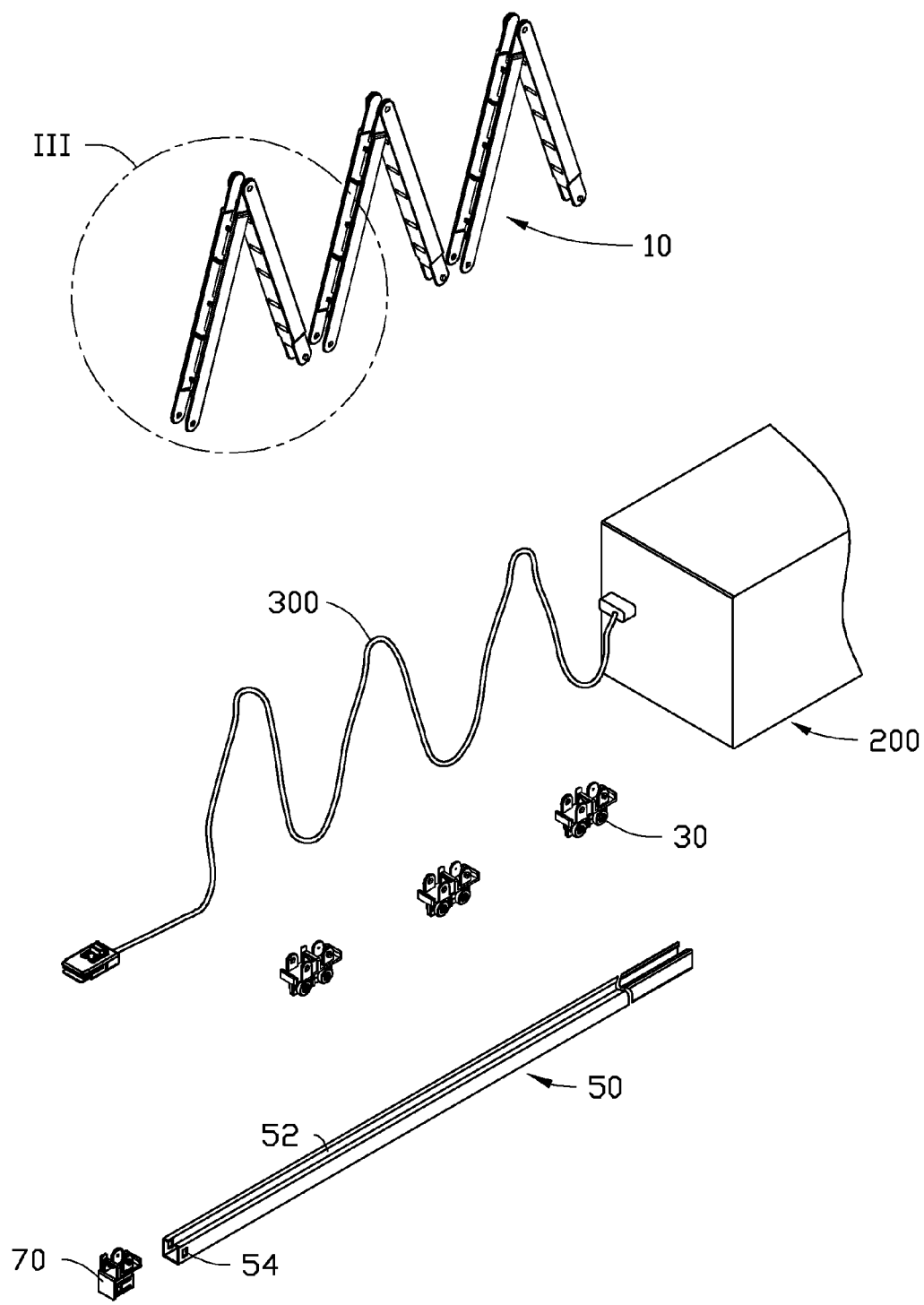
FIG. 2 is an exploded, isometric view of the cable management apparatus of FIG. 1, which includes three cable supports, three slide members, a guide rail, and a stop member.

Referring to FIG. 2, the cable management apparatus includes three cable supports 10, three slide members 30, a guide rail 50 fixed to a bottom of the chassis 100, and a stop member 70.

Figure 3:
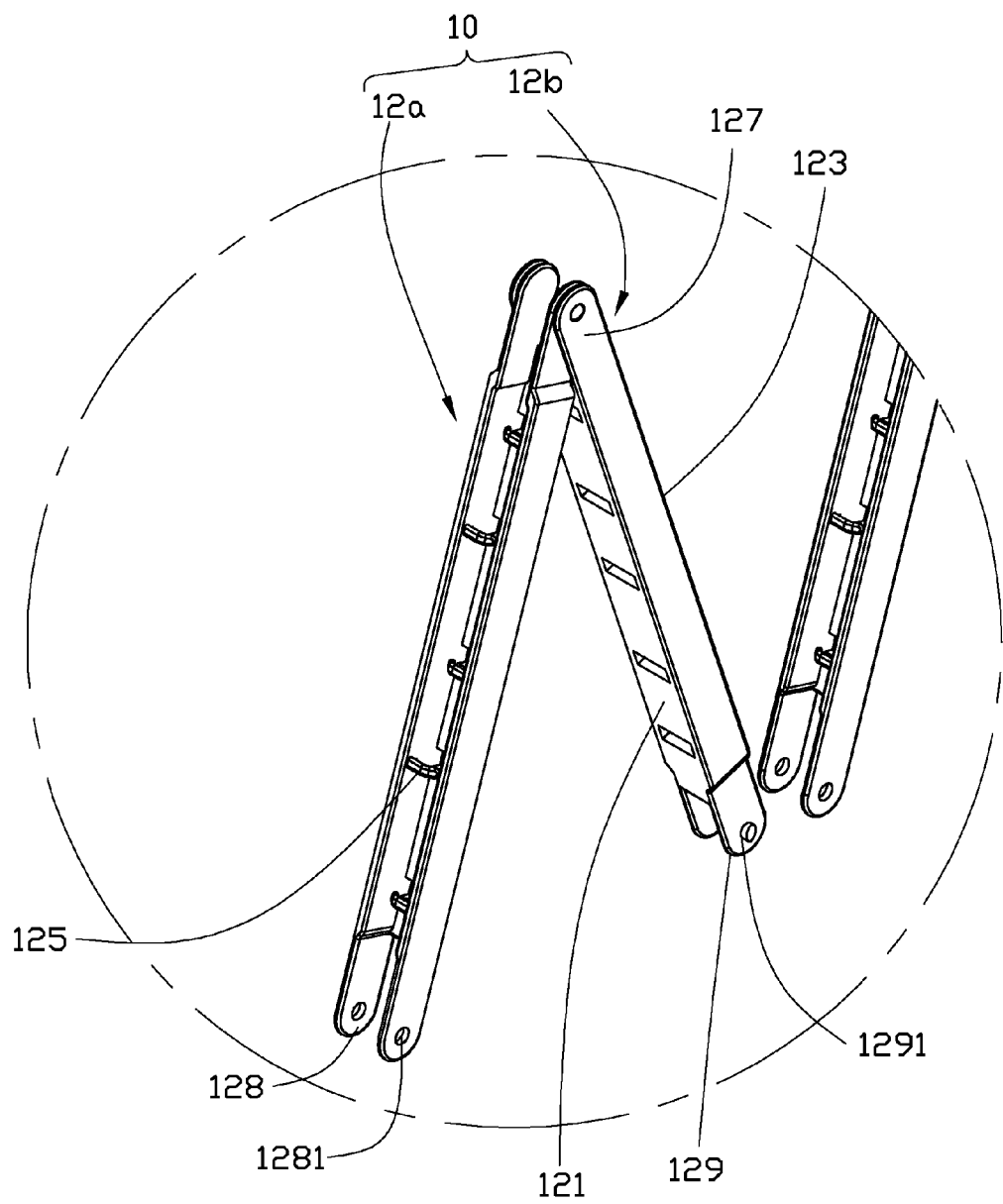
FIG. 3 is an enlarged view of the encircled portion III of FIG. 2.

Referring to FIG. 3, each of the cable supports 10 includes a first arm 12a and a second arm 12b. Each of the first and second arms 12a and 12b includes a long base 121, and two sidewalls 123 perpendicularly extending from opposite sides of the base 121, respectively. A plurality of holders 125 is arranged between the sidewalls 123, and extends from one of the sidewalls 123 to the other sidewall 123. First ends 127 of the first and second arms 12a and 12b are rotatably connected to each other. Each of the sidewalls 123 of the first arm 12a defines a pivot hole 1281 at a second end 128 of the arm 12a. Two pivot pins 1291 respectively extend out from the sidewalls 123 of the arm 12b at a second end 129 of the second arm 12b.

Figure 4:
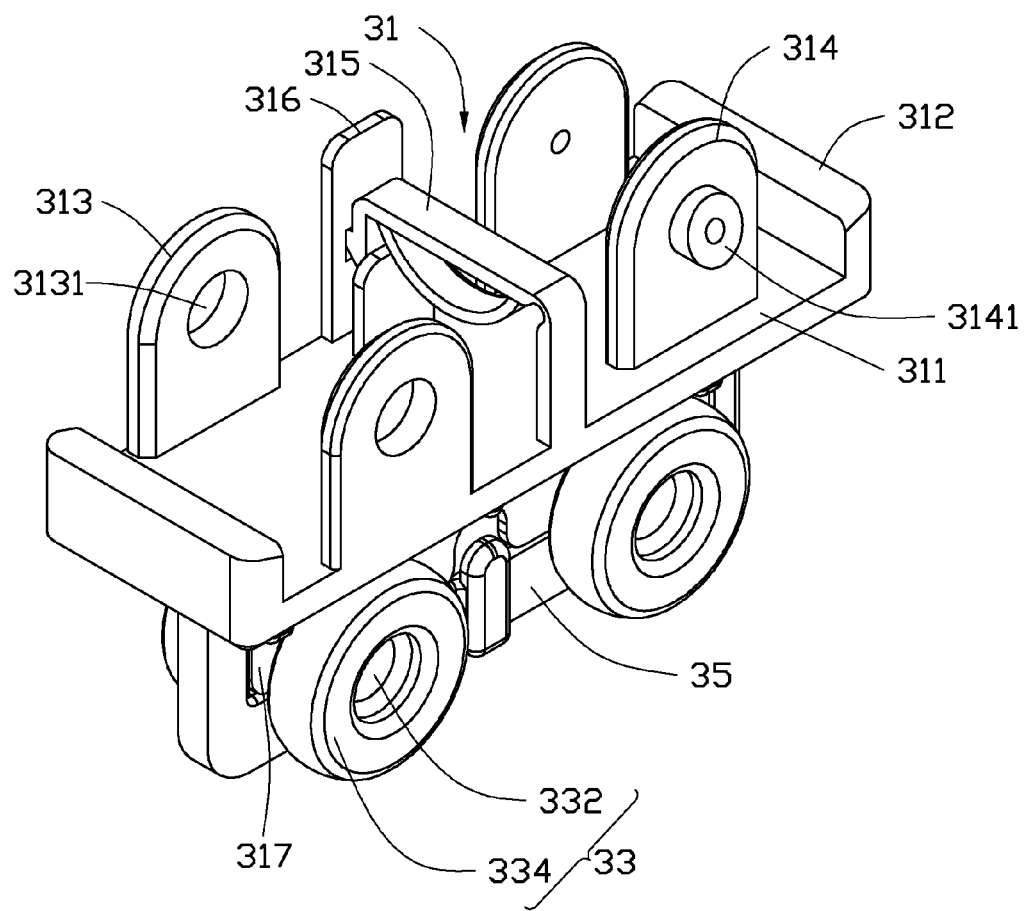
FIG. 4 is an enlarged view of one of the slide members of FIG. 2.
Figure 5:
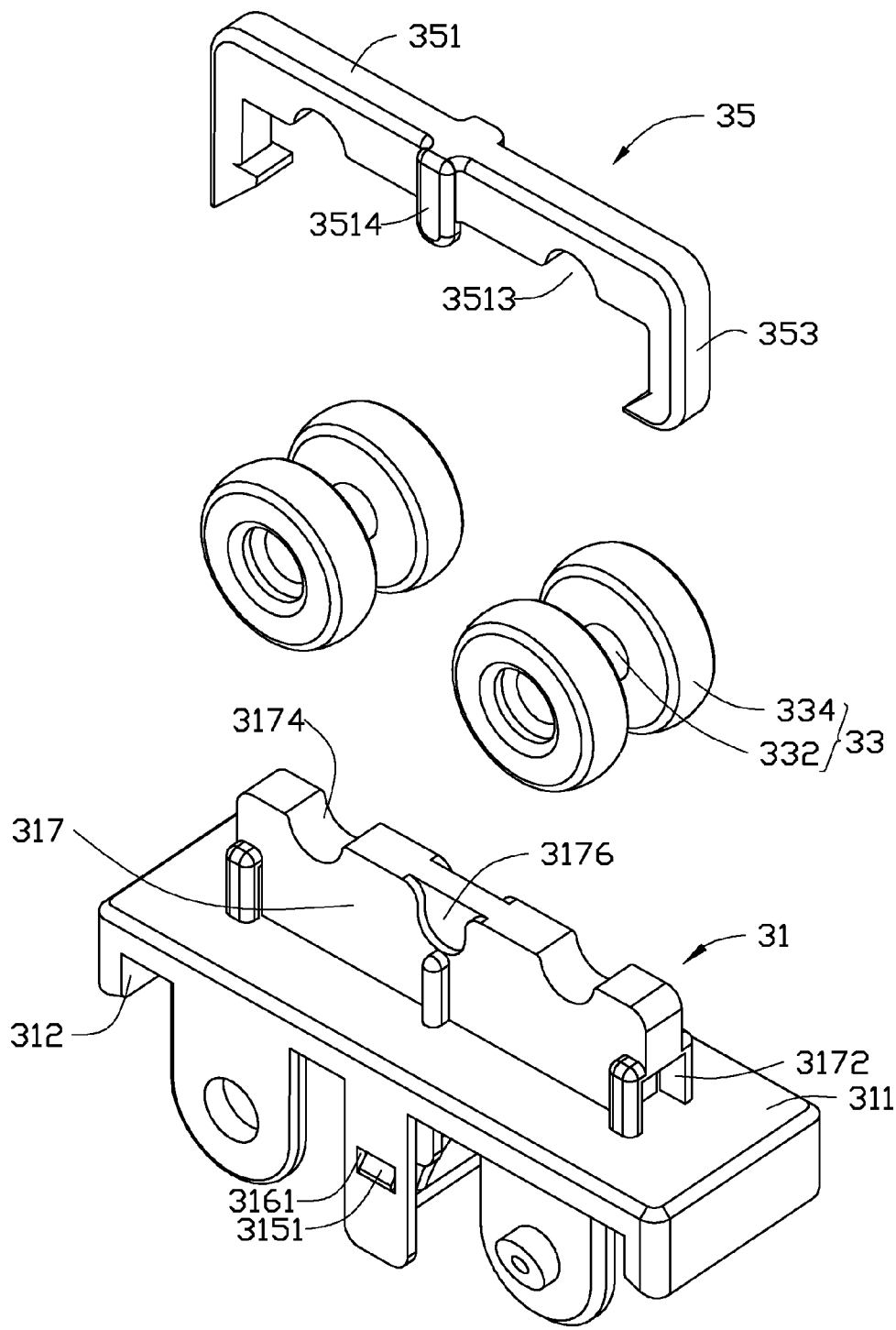
FIG. 5 is an exploded, isometric view of the slide member of FIG. 4, but showing an inverted view.

Referring to FIGS. 4 and 5, each of the slide members 30 includes a carriage 31, two wheel assemblies 33, and a fastening member 35.

The carriage 31 includes a bottom plate 311, two blocking tabs 312 extending up from opposite ends of the bottom plate 311, respectively, two first coupling portions 313 extending up from the bottom plate 311 adjacent to one of the blocking tabs 312, two second coupling portions 314 extending up from the bottom plate 311 adjacent to the other blocking tab 312, a substantially L-shaped band 315 extending from a middle of a first one of opposite sides of the bottom plate 311 toward a second one of the sides of the bottom plate 311, a locking tab 316 formed on the second side of the bottom plate 311, and a slide portion 317 extending down from the bottom plate 311. Each of the first coupling portions 313 defines a pivot hole 3131. A pivot pin 3141 extends from a side of each of the second coupling portions 314 opposite to the other second coupling portion 314. A hook 3151 is formed on a distal end of the band 315. The locking portion 316 defines a lock hole 3161. The slide portion 317 defines two retaining holes 3172 in opposite ends of the slide portion 317 adjacent to the bottom plate 311. Two semi-circular accommodating notches 3174 are defined in a bottom of the slide portion 317 opposite to the bottom plate 311. Two recesses 3176 are defined in opposite sides of a middle of the slide portion 317.

Each of the wheel assemblies 33 includes a shaft 332 and two wheels 334 mounted to opposite ends of the shaft 332.

The fastening member 35 is substantially U-shaped, and includes a beam 351, and two locking arms 353 perpendicularly extending up from opposite ends of the beam 351, respectively. The beam 351 defines two accommodating notches 3513 in a top corresponding to the accommodating notches 3174. Two positioning protrusions 3514 protrude from opposite sides of a middle of the beam 351, corresponding to the recesses 3176.

Referring to FIG. 2, the guide rail 50 is hollow and defines a rectangular cross section. A slide slot 52 is defined in a top of the guide rail 50, extending along a longwise direction of the guide rail 50. Two fixing holes 54 are defined in opposite sidewalls of the guide rail 50 at a first end of the guide rail 50.

Figure 6:
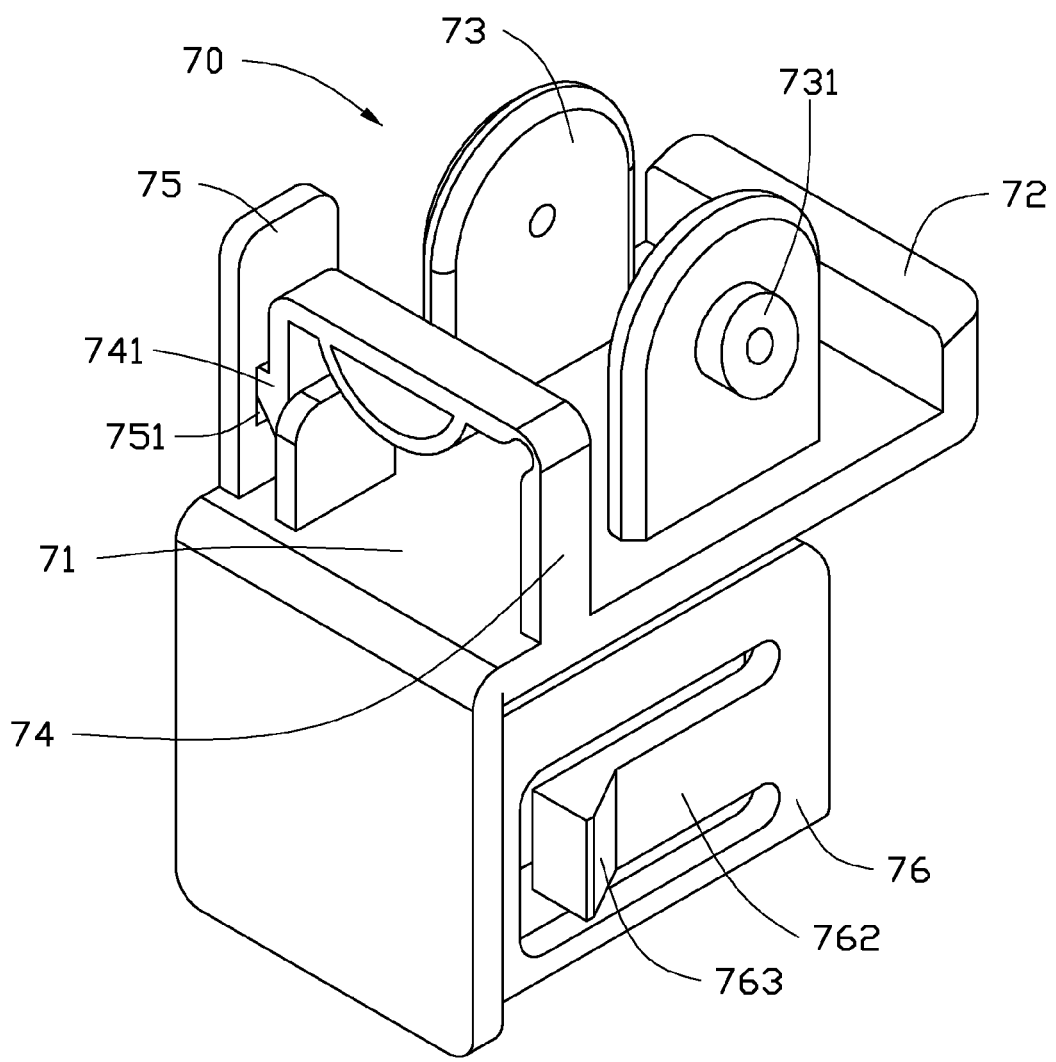
FIG. 6 is an enlarged view of the stop member of FIG. 2.

Referring to FIG. 6, the stop member 70 includes a bottom plate 71, a blocking tab 72 extending up from an end of the bottom plate 71, two coupling portions 73 extending up from the bottom plate 311, a substantially L-shaped band 74 extending up from a middle of a first one of opposite sides of the bottom plate 71 toward a second side of the bottom plate 71, a locking tab 75 formed on the second side of the bottom plate 71, and a support body 76 extending down from the bottom plate 71. A pivot pin 731 extends from a side of each of the coupling portions 743 opposite to the other coupling portion 73. A hook 741 is formed on a distal end of the band 74. The locking tab 75 defines a locking hole 751. Two resilient tabs 762 are respectively formed on opposite sides of the support body 76. A locating protrusion 763 protrudes out from a distal end of each of the resilient tabs 762.

In assembly of one of the slide members 30, the shafts 332 are respectively received in the accommodating notches 3174 of the carriage 31. The fastening member 35 is fixed to the carriage 31 with the locking arms 353 engaged in the corresponding retaining holes 3172, and the positioning protrusions 3514 engaged in the corresponding recesses 3176. The accommodating notches 3513 are aligned with the corresponding accommodating notches 3174 to rotatably locate the shafts 332 between the carriage 31 and the fastening member 35. The wheels 334 of each of the wheel assemblies 33 are arranged at opposite sides of the slide portion 317.

The slide members 30 are mounted to the guide rail 50 with the wheel assemblies 33 sliding into the guide rail 50 to be supported on a bottom of the guide rail 50. The slide portions 317 are slidably received in the slide slot 52. The stop member 70 is fixed to guide rail 50, with the support body 76 received in the guide rail 50, and the locating protrusion 763 retained in the corresponding fixing holes 54 of the guide rail 50.

Figure 7:
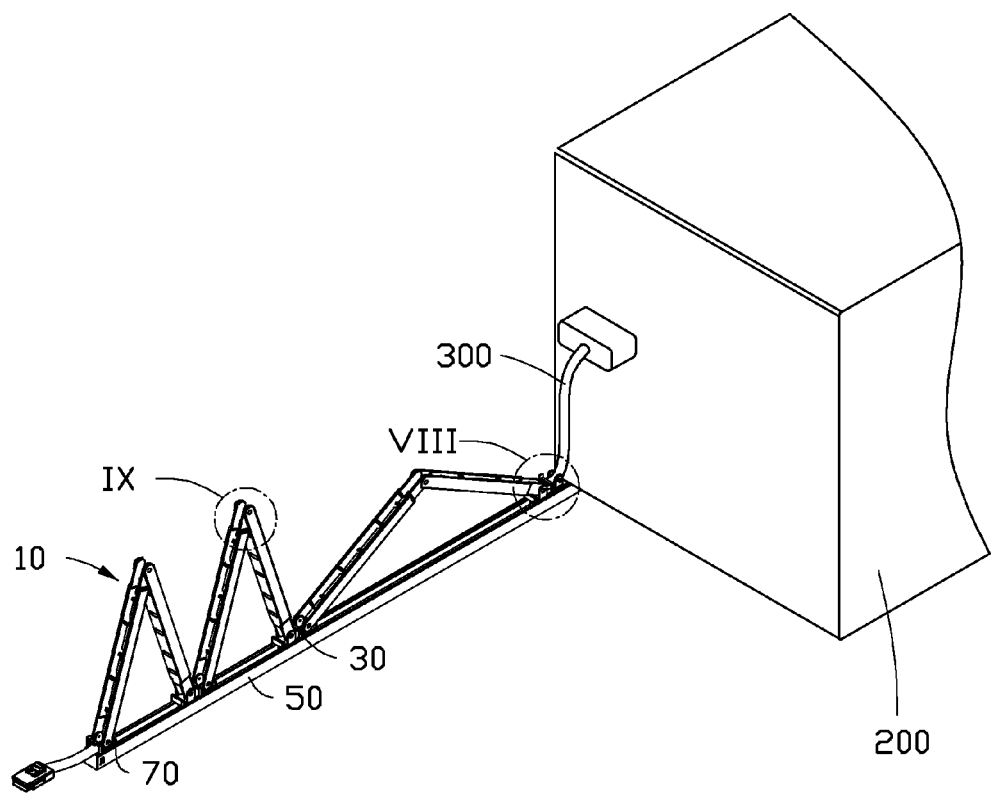
FIG. 7 is similar to FIG. 1, but showing the cable management apparatus in a different state, and omitting the chassis.
Figure 8:
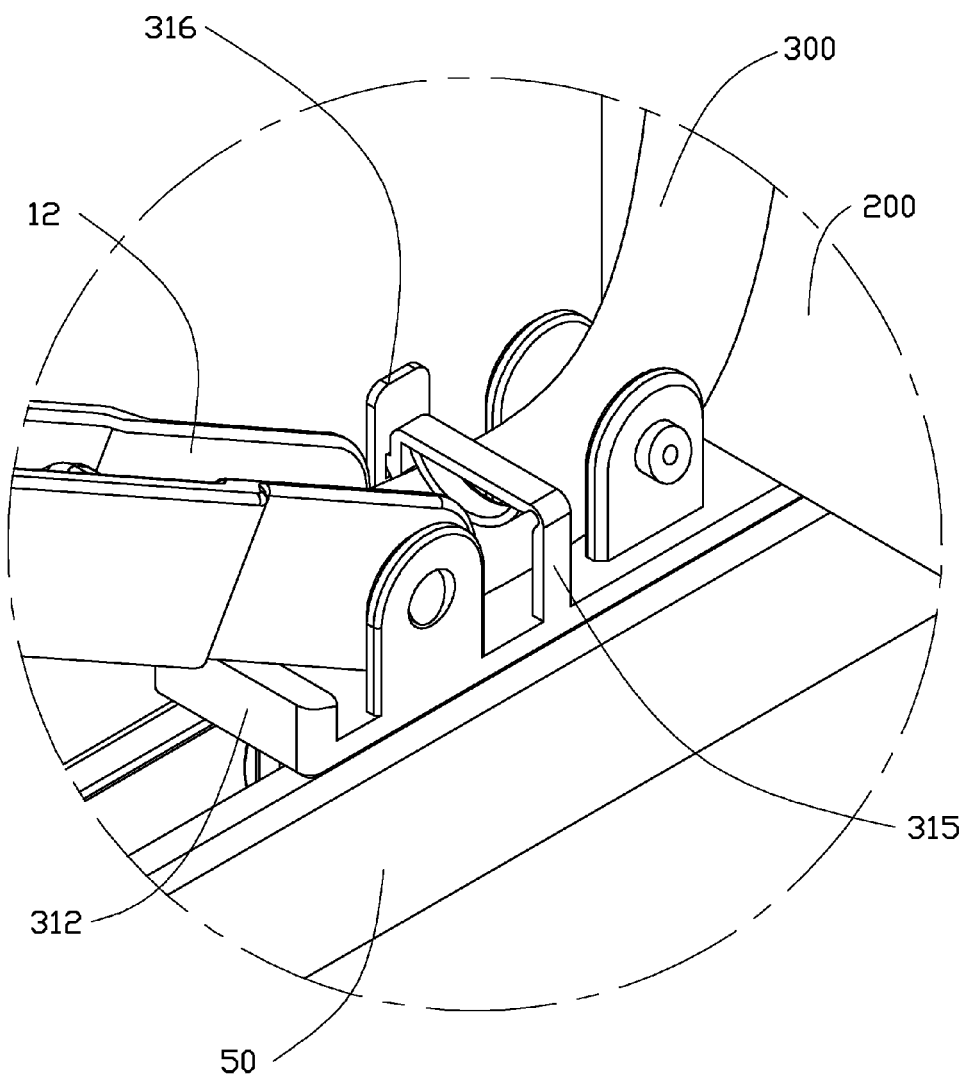
FIG. 8 is an enlarged view of the encircled portion VIII of FIG. 7.
Figure 9:
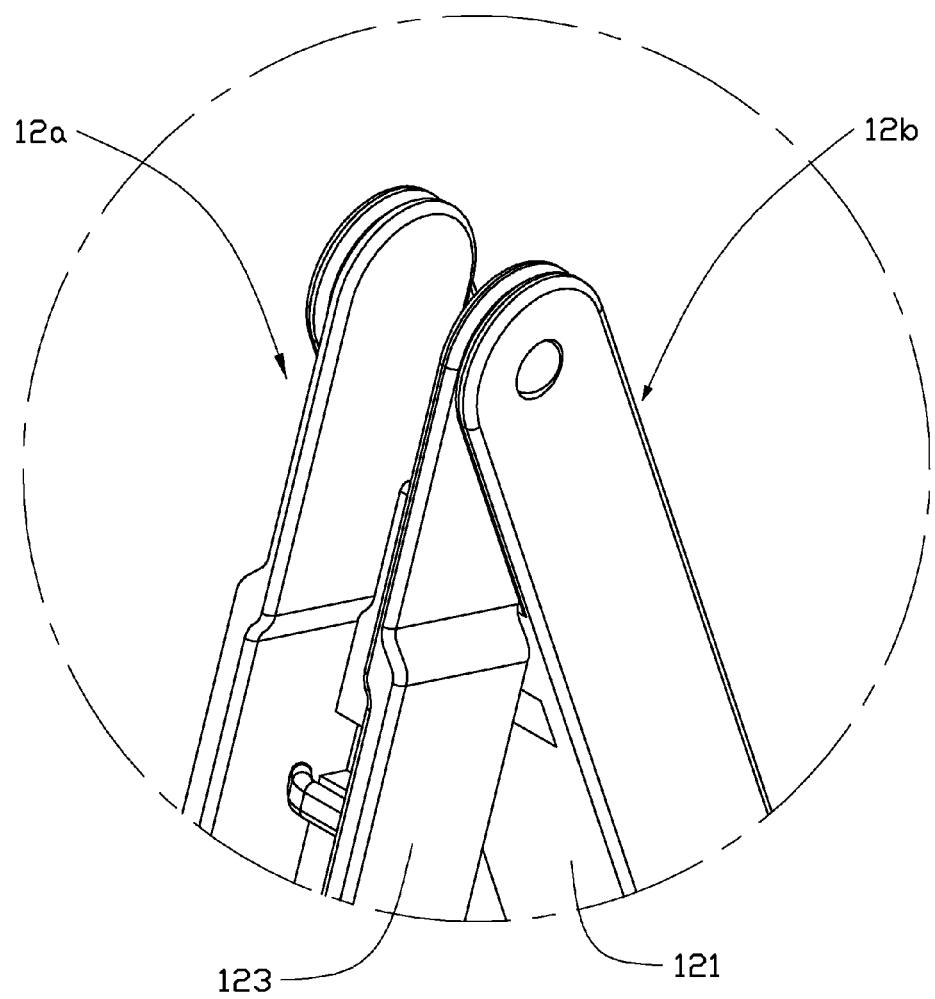
FIG. 9 is an enlarged view of the encircled portion IX of FIG. 7.

Referring to FIGS. 7-9, the second end of the first arm 12a of a first cable support 10 is rotatably connected to the stop member 70 through the pivot pins 731 rotatably engaged in the corresponding pivot holes 1281. The second end of the second arm 12a of the first cable support 10 is rotatably connected to a first slide member 30 adjacent to the stop member 70 through the pivot pins 1291 rotatably engaged in the corresponding pivot holes 3131. The second end of the first arm 12a of a second cable support 10 is rotatably connected to the first slide member 30 through the pivot pins 3141 rotatably engaged in the corresponding pivot holes 1281. The second end of the second arm 12b of the second cable support 10 is rotatably connected to a second slide member 30 adjacent to the first slide member 30 through the pivot pins 1291 rotatably engaged in the corresponding pivot holes 3131. The second end of the first arm 12a of a third cable support 10 is rotatably connected to the second slide member 30 through the pivot pins 3141 rotatably engaged in the corresponding pivot holes 1281. The second end of the second arm 12b of the third cable support 10 is rotatably connected to a third slide member 30 away from the stop member 70 through the pivot pins 1291 rotatably engaged in the corresponding pivot holes 3131.

When the electronic device 200 is mounted in chassis 100, the guide rail 50 is fixed to the chassis 100 adjacent to the cable 300. The third slide member 30 is fixed to the electronic device 200. The cable 300 extends through a space bounded by the base 121, the sidewalls 123, and the holders 125 of each of the first and second arms 12a and 12b. Therefore, the cable 300 is rested on the cable supports 30. The bands 315 bind the cable 300 together with the corresponding bottom plates 311. Therefore, the cable 300 is bound to the slide member 30 by the bands 315. In a similar way, the cable 300 is also bound to the stop member 70 by the band 74.

When the electronic device 200 is slid away from the stop member 70, the third slide member 30 slides along the guide rail 50 with the electronic device 200, thereby increasing an angle between the first and second arms 12a and 12b to spread the third cable support 10, until the first and second arms 12a and 12b of the third support 10 respectively abut against the corresponding blocking tabs 312 of the second and third slide members 30. The arms 12a and 12b are stopped from rotating further to ensure the angle between the first and second arms 12a and 12b less than 180 degrees, thereby facilitating folding the cable support 10 back. With the electronic device 200 sliding on, the second and first cable supports 10 spread one by one to spread the cable 300 orderly.

When the electronic device 200 is slid towards the stop member 70, the third slide member 30 is driven to slide along the guide rail 50 to fold the third cable support 10, until the sidewalls 123 of the first arm 12a abut against the base 121 of the second arm 12b. With the electronic device 200 sliding on, the second and first cable supports 10 are folded one by one to wind up the cable 300 orderly.

It is to be understood, however, that even though numerous characteristics and advantages of the embodiments have been set forth in the foregoing description, together with details of the structure and function of the embodiments, the present disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A cable management apparatus, comprising:
   a guide rail;
   a plurality of slide members slidably mounted to the guide rail; and
   a plurality of cable supports, wherein the cable supports are foldable and connected end to end through the slide members;
   wherein each of the cable supports comprises a first end and a second end, the first end of one of the cable supports and the second end of a next one of the cable supports are rotatably connected to a same one of the slide members, the cable supports are unfolded to spread a cable rested on and extending along the cable supports, in response to the slide members sliding to increase a distance between two adjacent ones of the slide members; and the cable supports are folded to wind up the cable, in response to the slide members sliding to decrease the distance between two adjacent ones of the slide members;
   wherein each of the slide members comprises a carriage, and at least one wheel assembly attached a bottom of the carriage and slidably rested on the guide rail, and the carriage comprises a first coupling portion and a second coupling portion to be correspondingly rotatably connected to the first end of one of the cable supports and the second end of a next one of the cable supports; and
   wherein the carriage of each of the slide members further comprises a bottom plate supporting the first and second coupling portions, and a band extending from the bottom plate, and the bands of the carriages bind the cable together with the corresponding bottom plates.

2. The cable management apparatus of claim 1, wherein each of the slide members further comprises a fastening member fixed to the carriage to sandwich the wheel assembly between the fastening member and the carriage.

3. The cable management apparatus of claim 1, wherein each of the first coupling portions defines a pivot hole, the first end of each of the cable supports comprises a pivot pin rotatably engaged in the pivot hole of the first coupling portion of the corresponding slide member.

4. The cable management apparatus of claim 1, wherein each of the second coupling portions comprises a pivot pin, the second end of each of the cable supports defines a pivot hole rotatably receiving the pivot pin of the second coupling portion of the corresponding slide member.

5. The cable management apparatus of claim 1, wherein the carriage of each of the slide members further comprises a slide portion protruding from the bottom plate, the wheel assembly of the slide member comprises a shaft rotatably engaged with the slide portion of the carriage, and two wheels fixed to opposite ends of the shaft and rested on the guide rail.

6. The cable management apparatus of claim 5, wherein the guide rail is hollow and has a rectangular cross section, a top of the guide rail defines a slide slot extending along a longwise direction of the guide rail, the wheel assemblies of the slide members are received in the guide rail, the slide portions of the carriages of the slide members are slidably engaged in the slide slot.

7. A server comprising:
a chassis;
a guide rail fixed to the chassis;
a plurality of slide members slidably mounted to the guide rail;
a plurality of cable supports connected end to end through the slide members, each of the cable supports comprising a first end and a second end,
an electronic device detachably mounted in the chassis; and
a cable extending from a rear end of the chassis, through and rested on the cable supports;
wherein one of the slide members is fixed to the electronic device and rotably connected to the second free end of one of the cable supports adjacent to the electronic device, other slide members are rotatably connected between the neighboring cable supports, the first end of one of the cable supports far way from the electronic device is rotatably connected to the guide rail; the cable supports are unfolded one by one to spread the cable, in response to the electronic device sliding away from the cable supports; the cable supports are folded one by one to wind up the cable, in response to the electronic device sliding toward the cable supports;
wherein each of the cable supports comprises a first arm and a second arm hinged to each other, the first ends of the cable supports are distal ends of the first arms, the second ends of the cable supports are distal ends the second arms, each of the slide members comprises at least one wheel assembly slidably rested on the guide rail, and a carriage fixed to the wheel assembly, and the carriage comprises a first coupling portion and a second coupling portion to be rotatably connected to the first end and the second end of the corresponding cable supports; and
wherein the carriage of each of the slide members further comprises a bottom plate supporting the first and second coupling portions, and a band extending from the bottom plate, and the bands of the carriages bind the cable together with the corresponding bottom plates.

8. The server of claim 7, wherein each of the first coupling portions defines a pivot hole, the second end of each of the cable supports comprises a pivot pin rotatably engaged in the pivot hole of the first coupling portion of the corresponding slide member.

9. The server of claim 7, wherein each of the second coupling portions comprises a pivot pin, the first end of each of the cable supports defines a pivot hole rotatably receiving the pivot pin of the second coupling portion of the corresponding slide member.

10. The server of claim 7, wherein the carriage of each of the slide members further comprises a slide portion protruding from the bottom plate, the wheel assembly of the slide member comprises a shaft rotatably engaged with the slide portion, and two wheels fixed to opposite ends of the shaft and rested on the guide rail.

11. The server of claim 10, wherein the guide rail is hollow with a rectangular cross section, a top of the guide rail defines a slide slot extending along a longwise direction of the guide rail, the wheel assemblies of the slide members are received in the guide rail, the slide portions of the carriages of the slide members are slidably engaged in the slide slot.

12. The server of claim 7, wherein the carriage of each of the slide member further comprises two blocking tabs extending up from opposite ends of the bottom plate, the blocking tabs abut against the corresponding first and second arms to ensure an angle between the first and second arms of each of the cable supports less than 180 degrees, in response to the electronic device sliding away from the cable supports.

13. The server of claim 7, further comprising a stop member fixed to the guide rail, the first end of the cable support farthermost from the electronic device is rotatably connected to stop member.

14. The server of claim 7, wherein each of the slide members further comprises a fastening member fixed to the carriage to sandwich the wheel assembly between the fastening member and the carriage.

* * * * *